US 7,496,822 B2

(12) United States Patent
Crosby

(10) Patent No.: US 7,496,822 B2
(45) Date of Patent: Feb. 24, 2009

(54) APPARATUS AND METHOD FOR RESPONDING TO DATA RETENTION LOSS IN A NON-VOLATILE MEMORY UNIT USING ERROR CHECKING AND CORRECTION TECHNIQUES

(75) Inventor: Robert M. Crosby, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 821 days.

(21) Appl. No.: 10/639,350

(22) Filed: Aug. 12, 2003

(65) Prior Publication Data

US 2004/0230879 A1 Nov. 18, 2004

(51) Int. Cl.
*G11C 29/00* (2006.01)
(52) U.S. Cl. ............... 714/763; 714/758; 714/49; 714/785; 714/799; 714/710; 714/718
(58) Field of Classification Search ............... 714/752, 714/763, 764, 785, 799, 49, 758
See application file for complete search history.

(56) References Cited

U.S. PATENT DOCUMENTS

| 5,490,155 | A  | * | 2/1996  | Abdoo et al. ............... 714/763 |
| 5,978,953 | A  | * | 11/1999 | Olarig ........................ 714/768 |
| 6,272,651 | B1 | * | 8/2001  | Chin et al. .................... 714/43 |
| 6,359,806 | B1 | * | 3/2002  | Nozoe et al. ........... 365/185.09 |
| 6,505,305 | B1 | * | 1/2003  | Olarig ........................... 714/5 |

* cited by examiner

*Primary Examiner*—Esaw T Abraham
(74) *Attorney, Agent, or Firm*—Frederick J. Telecky, Jr.; Wade J. Brady, III

(57) ABSTRACT

In a non-volatile memory unit such as a flash memory unit, the degradation of charge can result in an error during a read operation. By using the error checking and correction techniques, a determination can be made whether a detected error can be corrected and, if correctable, is the consistent with charge degradation at that bit position displaying the error. When a correctable error is detected, the signal group address and the correction pattern are stored and an interrupt request flag applied to the central processing unit. When the interrupt flag is processed, the central processing unit, using the signal group address and the correction pattern, restores the charge of the bit position in the memory unit. In this manner, further read operations involving the restored bit position will not repeat the corrected error.

5 Claims, 2 Drawing Sheets

APPARATUS AND METHOD FOR RESPONDING TO DATA RETENTION LOSS IN A NON-VOLATILE MEMORY UNIT USING ERROR CHECKING AND CORRECTION TECHNIQUES

FIELD OF THE INVENTION

This invention relates generally to the data processing systems and, more particularly, to error checking and correction techniques used in connection with a non-volatile memory unit such as a flash memory unit.

BACKGROUND OF THE INVENTION

Referring to FIG. 1, a block diagram of a data processing system 10 that includes error checking and correction capability according to the prior art is shown. The data processing system 10 includes a central processing unit 11 and a memory unit 12. The central processing unit 11 exchanges signals with apparatus not shown, but which, for example, can include peripheral devices, keyboard signals, etc. The central processing unit 11 applies address signals to the main memory 121 and to the error checking and correction memory 122. The central processing unit 11 also applies data signals to the main memory 121 and the error checking and correction memory 122. The main memory 121, during a read operation, applies signals to a check bit calculation unit 123. The check bit calculation unit 123 and the error checking and correction memory 122 apply signals to the syndrome calculation unit 124. The syndrome calculation unit 124 applies data signals and the syndrome unit 124 applies syndrome signals to the bit correction unit 125.

The operation of the data processing system 10 can be understood as follows. The central processing unit 11, in a write operation of a signal group, generates the error checking and correction signals associated with the signal group to be stored in the main memory 121. The signal group is then stored in the main memory 121 and the error checking and correction signals are stored in the error checking and correction memory 122 at the same address. In a read operation, the addressed signal group in the main memory 121 is applied to the check bit calculator 123 while the associated (i.e., at the same address) error checking and correction signals in the error checking and correction memory 122 are transferred to the syndrome calculation unit 124. The check bit calculation unit 123 provides error checking and correction signals to the syndrome calculation unit 124. Based on a comparison of the signals from the check bit calculation unit 123 and the error checking and correction signals from the error correction code memory, the syndrome calculation unit 124 provides a group of syndrome signals that identifies the correctable bit position in the data signal group. The group of syndrome signals is applied to the bit correction unit 125. In the bit correction unit, the data signal group from the main memory 121 is corrected and transferred to the central processing unit 11.

While the foregoing operation has proven successful for correcting data signal groups stored in a non-volatile memory, one problem is that this error will need to be corrected for every read operation. However, when an error in a different position in the data signal group is identified, the single bit error correcting procedures will not be adequate and the data processing unit forced to respond to an uncorrectable error.

A need has therefore been felt for apparatus and associated method for using an error checking and correction algorithm for correcting a bit in a data signal group. It would be another feature of the apparatus and associated method to identify a failing bit as a cause of an error in the data signal group. It would be yet another feature of the apparatus and associated method to restore the charge on the failing bit in the main memory or error checking and correction memory.

SUMMARY OF THE INVENTION

The aforementioned and other features are accomplished, according to the present invention, by providing the main memory with error checking and correction apparatus and with apparatus identifying a signal group error, detected by the error checking and correction apparatus, as a the result of a failing bit position in the main memory or the error checking and correction memory. A failing bit position occurs in a non-volatile main memory implemented, for example, in flash technology when charge leakage changes the state of original or default state of the bit location. When a correctable data signal group error is identified in a read operation, the error is corrected and the data signal group is forwarded to the central processing unit. In addition, the address and the location of the location of the error are stored. An interrupt flag is available to the central processing unit. When the central processing unit can be interrupted, the central processing unit restores the location in the main memory where the error originated based on the stored address and location. The error correcting apparatus will thereafter not be burdened with correcting errors in the same bit location. Additionally, it is sometimes desirable to leave unprogrammed locations in the memory where tables can be updated without erasing the location contents. When the existing table is to be updated, the old information is programmed to be all logic "0"s. The corresponding correction bits are programmed to be all logic "0"s. The new table with its new correction bits is then programmed into new, usually successive locations that were previously all logic "1"s (all erased bits). To facilitate this requirement, additional circuitry is added to suppress optionally error corrections when the data and the correction bits are all in the logic "1"s or logic "0"s state.

Other features and advantages of the present invention will be more clearly understood upon reading of the following description and the accompanying drawings and claims.

DESCRIPTION OF THE PREFERRED EMBODIMENT.

1. Detailed Description of the Drawings

Figure 1:
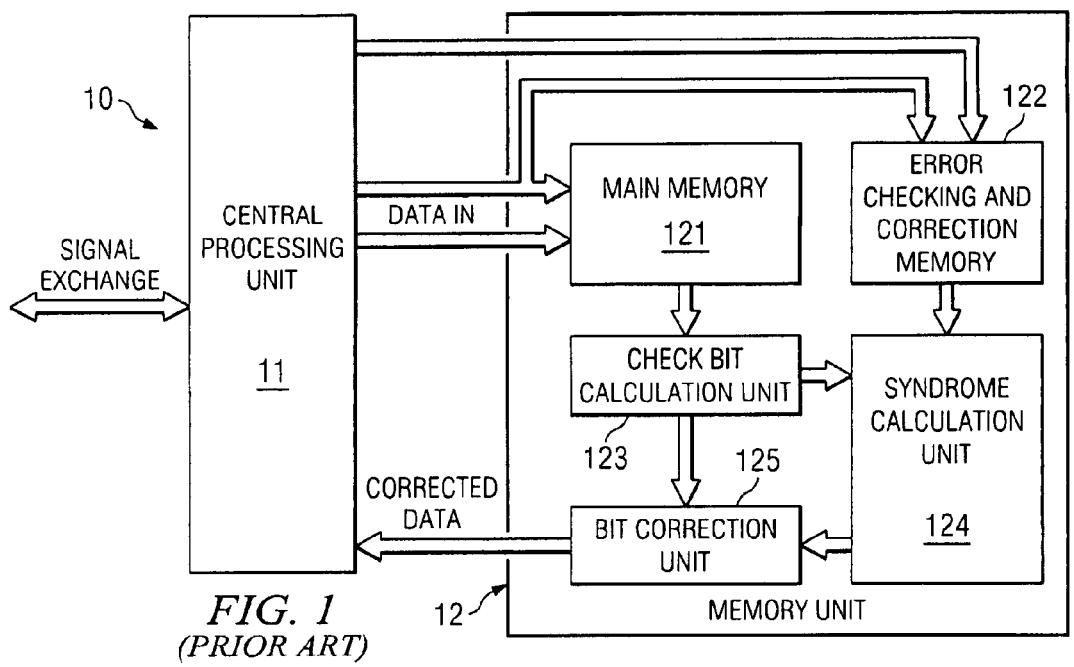
FIG. 1 is a block of a central processing unit and a main memory unit having error checking and correction capability according to the prior art.

FIG. 1 has been described with respect to the related art.

Figure 2:
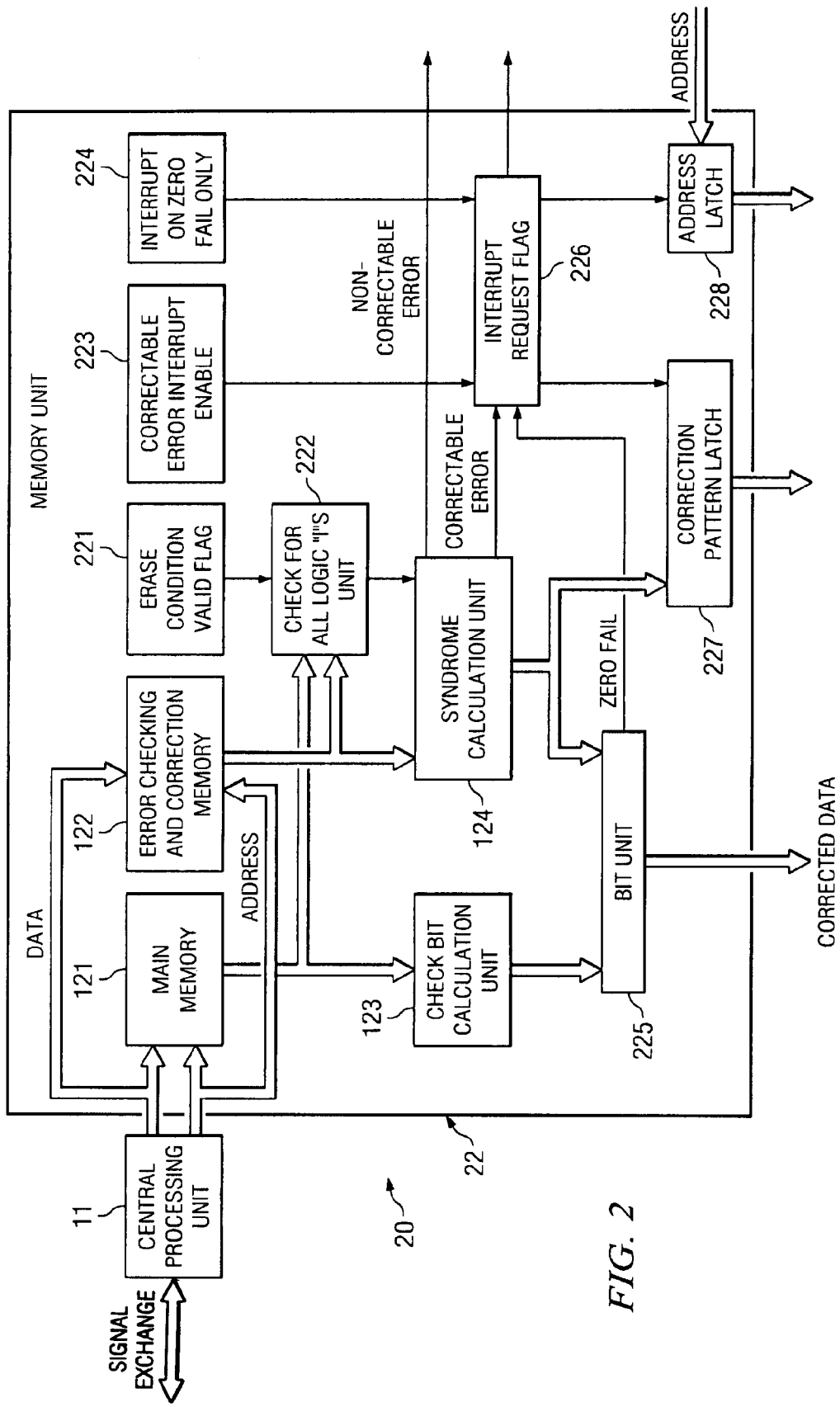
FIG. 2 is a block diagram of a central processing unit having error checking and correction capability as well as failing bit identification and restoration apparatus according to the present invention.

Referring next to FIG. 2, a block diagram of data processing system 20 according to the present invention is illustrated.

The central processing unit 11, the main memory unit 121, the error checking and correction memory 122, and the syndrome calculation unit 124 perform essentially the same functions as described in FIG. 1. The bit correction unit 225 has an additional function as compared to the bit correction unit 125 of FIG. 1. In particular, when the bit location that is failing displays a logic "1" as compared to a correct logic "0", an interrupt request flag indicative of a failing zero bit position is generated. The present invention has three control signals that are illustrated by the erase condition valid flag 221, the correctable error interrupt enable 223, and the interrupt on zero fail only 224. These control signals are applied to the interrupt flag request unit 226. Based on these signals, the correction pattern latch unit 227 and the address latch 228 will store appropriate signal groups until the central processing unit 11 responds to a signal from the interrupt request flag unit 226. When the signal from the interrupt request flag unit 226 is serviced, the contents of the correction pattern latch 227 and the address latch 228 are forwarded to the central processing unit 11.

The erase condition valid flag signal 221 provides that when a group memory of locations have had no data stored therein, the storage locations are in the erase condition and are indicative of logic "1"s, then no correction is done. Normally, the erased condition would generate a non-correctable error. Setting the erase condition valid flag allows this error to be ignored.

The interrupt on zero fail only signal provides that an interrupt request flag will be set when, in the normal correction of signal groups, the correction is to change a logic "1" to a logic "0". The correction is consistent with a charge loss in a bit location. The correction of a logic "0" to a logic "1" is not consistent with a charge loss in a bit location in the present example. When a correctable error meeting the foregoing requirements is identified, then a signal from the bit correction unit 225 is applied to the interrupt request flag unit. The results of the syndrome calculation unit 124 are latched in the correction pattern latch unit 227 until the central processing unit can service the interrupt.

The correctable error interrupt enable signal allows correctable errors optionally to generate an interrupt request. When the error is not correctable, then the central processing unit 11 is notified of a non-correctable error and the currently executing process is aborted.

Figure 3:
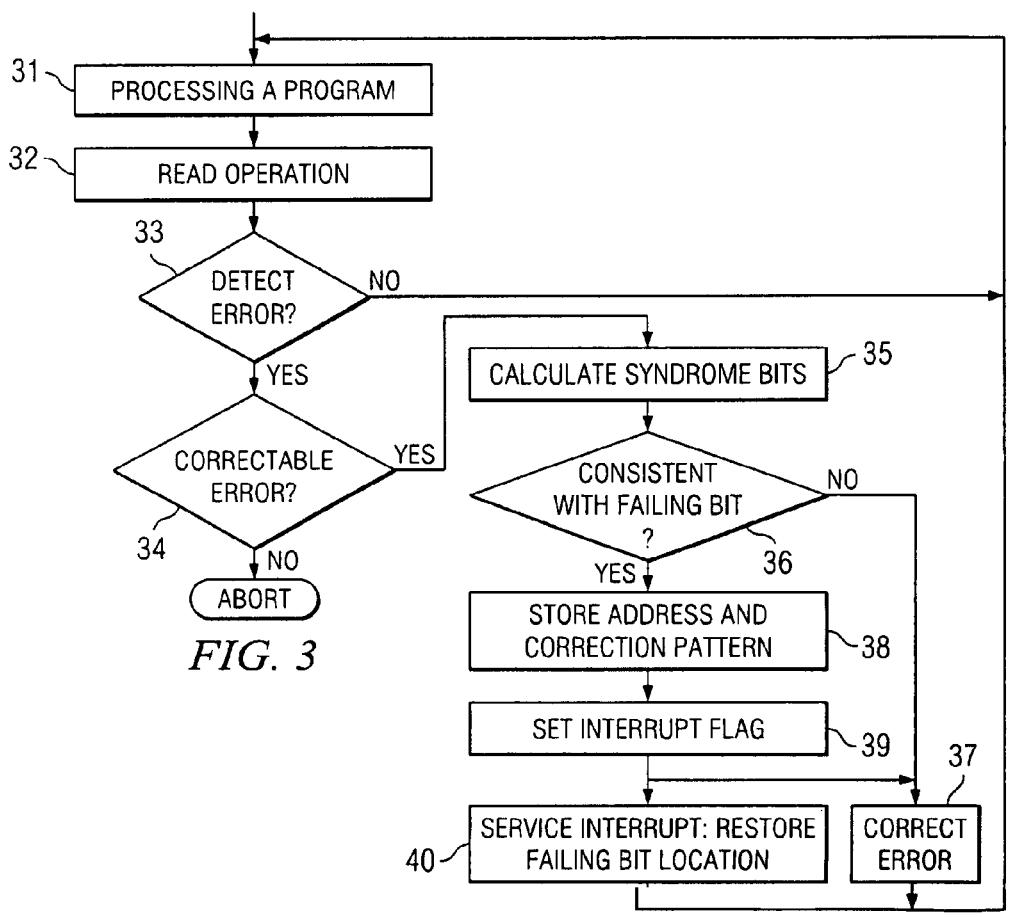
FIG. 3 is flow chart illustrating the response to an error detected during a read operation according to the present invention.

Referring to FIG. 3, a process for responding to a detected error according to the present invention is shown. In step 31, the central processing unit is executing instructions of a program. In step 32, a read operation for retrieval of signal groups from the memory unit is instituted. A determination is made by the error checking and correction apparatus whether the retrieved signal group has an error in step 33. When no error is detected in step 34, the procedure returns to step 31. When an error is detected in step 33, then a determination is made whether the detected error (or errors) is correctable. When the detected error is not correctable in step 34, then the operation of the processing unit or at least that program is aborted. When in step 34 the detected error is correctable, then the syndrome bits are calculated in step 35. In step 36, a determination is made whether the error is consistent with a failing bit in the main memory. When the detected failing bit is not consistent with a failing bit location in the main memory, then the erroneous bit is corrected in step 37 and the process returned to step 31 for execution of the program. When, in step 36, the detected error is consistent with a failing bit location, then the address of the signal group in which the error was detected and the correction pattern are stored in step 38. In step 39, an interrupt flag is set. The procedure then corrects the error and returns to step 31. In step 40, the interrupt flag is serviced by the central processing unit. The charge on the failing bit location is restored and the process returns to step 31.

2. Operation of the Preferred Embodiment

The operation of the present invention can be understood as follows. The invention relies on the fact that certain non-volatile memories, such as flash memory units or EEPROM (electrically erasable programmable read only memory) units, have a first state, i.e., a logic "0" state determined by a stored charge. When the stored charge decays a sufficient amount, then the bit location will be read as logic "1". The error checking and correction apparatus will determine the presence of an error state. In the example given above, the data signal groups stored in main memory is 64 bits. The check bit signal groups stored in the error checking and correction memory unit are 8 bits in length. The syndrome bits would therefore be 72 bits in length. Such an error checking and correction technique can identify a single correctable error or can identify two errors that cannot be corrected. As will be clear to those skilled in the art, more elaborate error checking and correction schemes are available and can be used advantageously with the present invention. When the error checking and correction unit determines that a bit signal that should be a logic "0" is a logic "1", this error can be caused by a decay of the charge at the memory location. The response of the present invention, upon detection of an error that could be the result of decay of charge from a bit location, is to restore the charge at the bit location. The restoration of charge is the result of setting an interrupt flag. In addition, the address and the correction pattern of the signal group having the error are stored. When the central processing unit responds to the interrupt flag, the address and correction pattern are transferred to the central processing unit. The central processing unit can restore the charge of the failing bit location or can restore either the signal group locations in the main memory or in the error checking and correcting memory unit depending on the position of the correctable error.

While the invention has been described with respect to the embodiments set forth above, the invention is not necessarily limited to these embodiments. Accordingly, other embodiment variations, and improvements not described herein, are not necessarily excluded from the scope of the invention, the scope of the invention being defined by the following claims.

What is claimed is:

1. A data processing system, comprising:
   a non-volatile memory unit having an address input, a data input and a corrected data output, the non-volatile memory unit comprising:
   a main memory coupled to the data input and the address input for storing signal groups;
   an error checking and correction (ECC) memory coupled to the data input and the address input for storing error correction bits, wherein the main memory and the ECC memory determine a first logic state by means of a stored charge and determine a second logic state by means of a lack of stored charge;
   an error checking and correction (ECC) circuitry coupled to the main memory and to the FCC memory being operable to detect an error in a signal group retrieved from the main memory in response to an address provided on the address input, and being operable to correct the error in the signal group and to output the corrected signal group on the corrected data output, the ECC circuitry comprising:

an interrupt circuitry operable to selectively signal an interrupt, such that an interrupt is signaled when the ECC circuitry determines the error in the signal group resulted from a bit signal that should be in the first state but was instead in the second state, and such that an interrupt is not signaled when the ECC circuitry determines the error in the signal group resulted from a bit signal that should be in the second state but was instead in the first state.

2. The data processing system of claim 1, wherein the ECC circuitry further comprises:

an address latch coupled to the address input to hold an address of the signal group having an error;

a pattern latch to hold a correction pattern generated by the ECC circuitry of the signal group having an error; and wherein the address latch and the pattern latch have outputs operable to be accessed in response to an interrupt signaled by the interrupt circuitry.

3. The data processing system of claim 1, wherein the main memory and the ECC memory are implemented in a technology selected from the group consisting of flash technology and EEPROM technology.

4. The data processing system of claim 2, further comprising a processor coupled to the non-volatile memory unit's address input, data input and corrected data output, the processor being responsively coupled to the interrupt circuitry; and wherein the processor is operable to respond to an interrupt from the interrupt circuitry by restoring a charge on a failing memory bit location in the main memory or in the ECC memory by writing to the address provided by the address latch.

5. the data processing system of claim 1, wherein the ECC circuitry further comprises detection circuitry, the detection circuitry operable to determine when a signal group stored in the main memory and in the error signal memory are all logic "1"s.

* * * * *